(12) United States Patent  (10) Patent No.: US 7,738,281 B2
Iida                      (45) Date of Patent:     Jun. 15, 2010

(54) SEMICONDUCTOR STORAGE DEVICE

(75) Inventor: Masahisa Iida, Osaka (JP)

(73) Assignee: Panasonic Corporation, Osaka (JP)

( * ) Notice: Subject to any disclaimer, the term of this patent is extended or adjusted under 35 U.S.C. 154(b) by 40 days.

(21) Appl. No.: 11/907,741

(22) Filed: Oct. 17, 2007

(65) Prior Publication Data

US 2008/0094921 A1    Apr. 24, 2008

(30) Foreign Application Priority Data

Oct. 23, 2006  (JP) .............................. 2006-287548

(51) Int. Cl.
     *G11C 11/24* (2006.01)
(52) U.S. Cl. .................. 365/149; 365/230.08; 365/203
(58) Field of Classification Search ................. 365/149, 365/230.08, 203, 205, 207, 208, 222, 230.03, 365/228, 230.06
     See application file for complete search history.

(56) References Cited

U.S. PATENT DOCUMENTS

| 5,654,913 | A  | * | 8/1997 | Fukushima et al. ......... 365/149 |
| 6,049,493 | A  |   | 4/2000 | Kitamoto et al. |
| 6,265,858 | B1 | * | 7/2001 | Park ............................. 323/313 |
| 7,375,999 | B2 | * | 5/2008 | Vogelsang ................... 365/149 |
| 2002/0001251 | A1 | * | 1/2002 | Fujino et al. ........... 365/230.08 |
| 2003/0223277 | A1 |   | 12/2003 | Origasa |
| 2004/0052102 | A1 | * | 3/2004 | Noda ......................... 365/149 |
| 2004/0114447 | A1 |   | 6/2004 | Ooishi |
| 2008/0151598 | A1 | * | 6/2008 | Madan ....................... 365/145 |

FOREIGN PATENT DOCUMENTS

JP            11-16354        1/1999

* cited by examiner

*Primary Examiner*—Dang T Nguyen
(74) *Attorney, Agent, or Firm*—McDermott Will & Emery LLP

(57) ABSTRACT

A semiconductor storage device according to the present invention comprises a plurality of memory cells each provided with an access transistor in which a source is connected to a bit line and a gate is connected to a word line and a capacitor in which a storage electrode is connected to a drain of the access transistor, the plurality of memory cells being placed in a matrix shape in column and row directions, a sense amplifier circuit connected to the source of the access transistor via the bit line, a bit-line precharge voltage generating circuit for generating a bit-line precharge voltage lower than a sense amplifier supply voltage to be supplied to the sense amplifier circuit and supplying the generated bit-line precharge voltage to the bit line, and a cell plate voltage generating circuit for generating a cell plate voltage set to be lower than the bit-line precharge voltage and supplying the generated cell plate voltage to a plate electrode of the capacitor.

12 Claims, 11 Drawing Sheets

F I G. 3
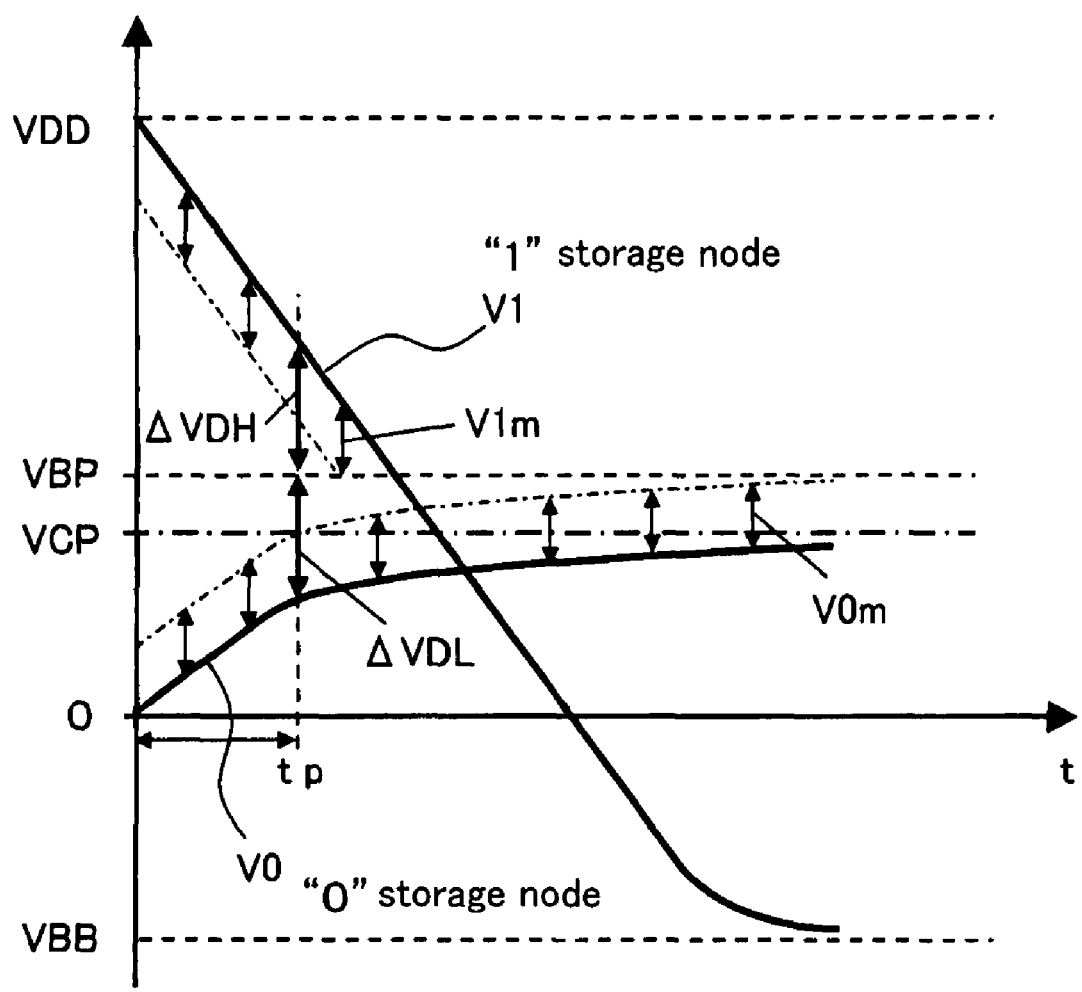

F I G. 5
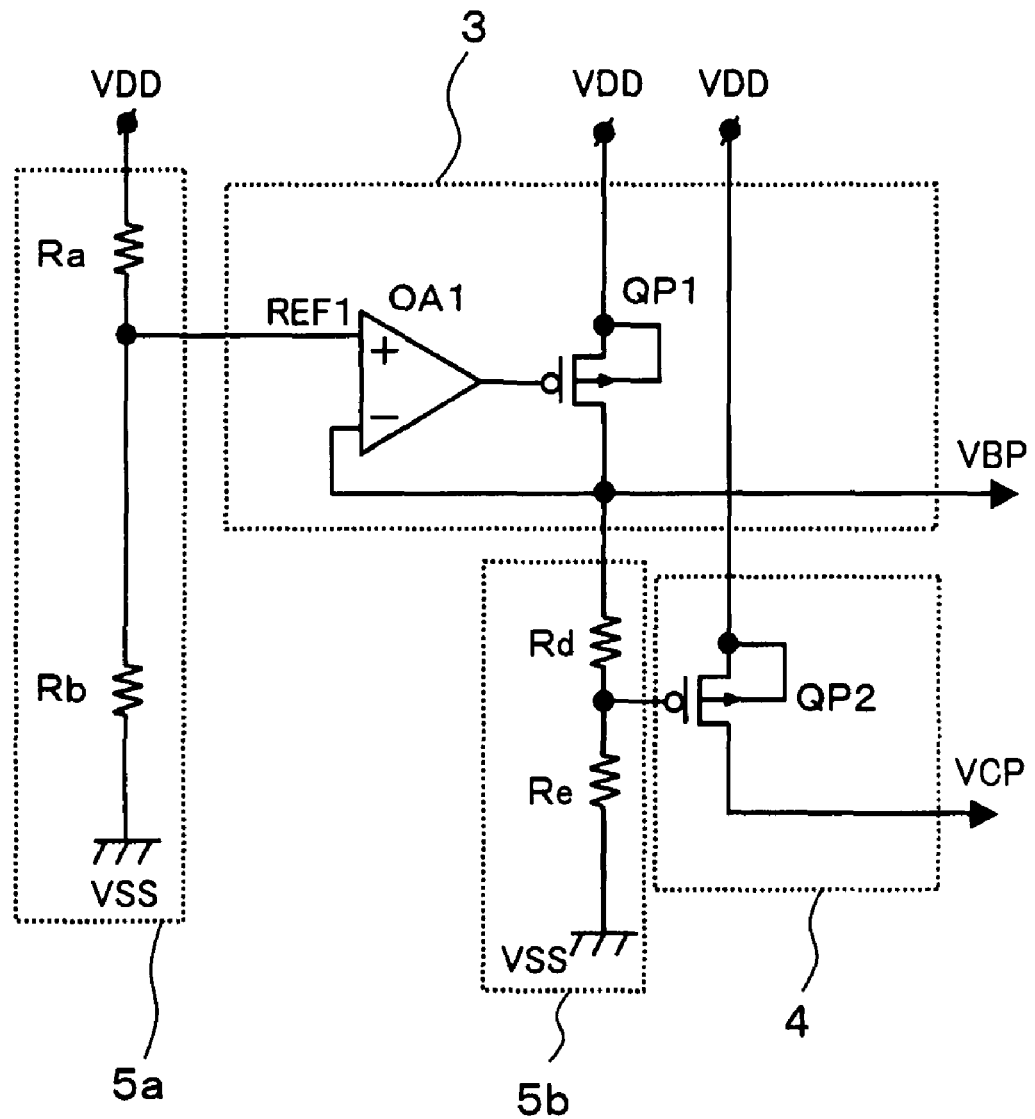

F I G. 9
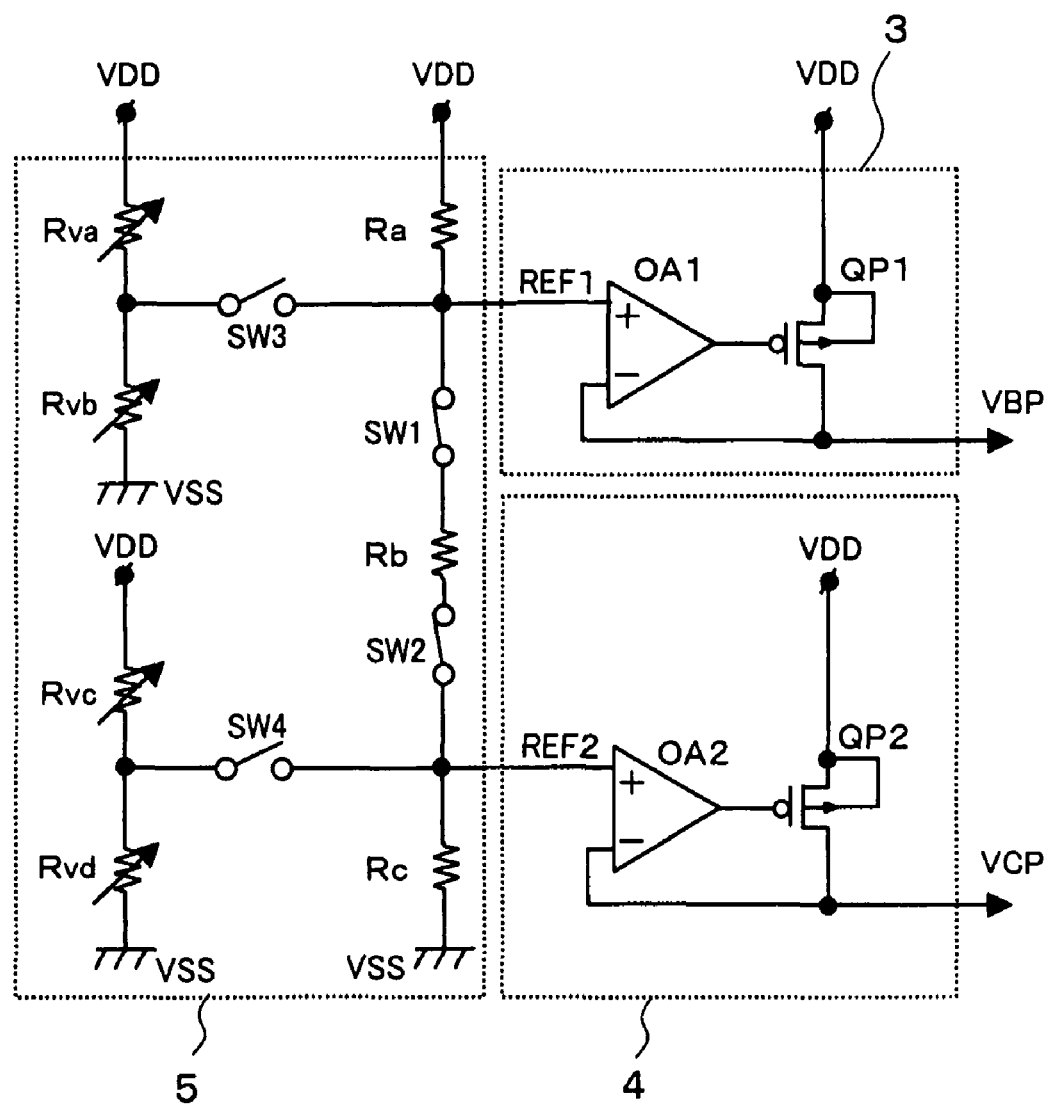

SEMICONDUCTOR STORAGE DEVICE

BACKGROUND OF THE INVENTION

1. Field of the Invention

The present invention relates to a semiconductor storage device, more specifically to a technology for improving retention characteristics of data "1" and "0" in DRAM.

2. Description of the Related Art

In recent years, an increasingly higher integration is demanded in, particularly, an embedded DRAM in order to realize the SOC (system on chip) with reduced costs. In the DRAM, a memory array unit comprising a large number of memory cells occupies a large portion of a memory area. Therefore, in order to realize a consolidated DRAM which is more integrated, it is important to reduce an area of the memory cell itself. The memory cell is provided with a memory-cell transistor and a memory capacitor comprising an insulation film having a high dielectric constant, and it is important to miniaturize the memory capacitor in order to reduce the area of the memory cell.

In the memory cell of the stack type, the miniaturization reduces a surface area of the memory capacitor; however, the capacity of the memory capacitor is secured because an insulation film whose dielectric constant is high is adopted. It is necessary to reduce the thickness of the insulation film as thin as possible in order to increase the capacity of the memory capacitor, which, however, unfavorably increases a tunnel leak current of the insulation film of the capacitor. Further, a storage node is silicided because the miniaturizing process demands a logic compatibility, which, however, becomes a factor responsible for increasing a junction leakage in the storage node.

FIG. 10 schematically shows a retention time dependency of a storage node voltage by the leak current. In "0" data, a tunnel leakage of the insulation film of the capacitor is dominant, and the storage node voltage thereby increases toward a cell plate voltage VCP over time. In "1" data, the storage node voltage is finally reduced toward a substrate bias voltage VBB under the influences of junction and channel leakages of an access transistor.

Assuming that:

a parasitic capacitance per bit line is Cb;

a capacity of a capacitor C is Cs;

a potential difference between a bit-line precharge voltage VBP and a "0" storage node voltage V0 is $\Delta$VDL ($\Delta$VDL=VBP−V0); and a potential difference $\Delta$VDH between a "1" storage voltage V1 and the bit-line precharge voltage VBP is ($\Delta$VDH=V1−VBP), a dimension of a sensing signal $\Delta$VL of the "0" data, and a dimension of a sensing signal $\Delta$VH of the "1" data are respectively expressed as follows.

$$\Delta VL = k \cdot \Delta VDL = k \cdot (VBP - V0)$$

$$\Delta VH = k \cdot \Delta VDH = k \cdot (V1 - VBP)$$

$$k = 1/(Cb/CS+1)$$

The sensing signal $\Delta$VL denotes a potential difference generated between compensating bit lines BL and BL when data in a memory cell MC ("0" or "1") is read onto the bit line BL during a retention time tp.

It is assumed that a lower-limit value of a differential voltage (V1−VBP) in the "1" storage voltage V1 is V1m, and a lower-limit value of a differential voltage (VBP−V0) in the "0" storage node voltage V0 is V0m. An effective range of the lower-limit value V0m in the "0" storage node voltage V0 extends considerably further in terms of time, while an effective range of the lower-limit value V1m of the "1" storage voltage V1 ends considerably earlier in terms of time. More specifically, an amount of the sensing signal of the "1" data is significantly reduced after the retention time tp has passed because the leak current of the "1" data is relatively large. Therefore, the effective range of the lower-limit value V1m of the "1" storage voltage V1 rate-controls the retention time tp.

As shown in FIG. 11, there is available a method of improving the "1" data retention time (the retention time in the "1" storage voltage V1 is extended) by reducing the bit-line precharge voltage VBP and securing the sensing signal of the "1" data after the retention time has passed. An example of the method is recited in Japanese Patent Laid-Open No. H11-16354 of Japanese Patent Documents.

In this example, the bit-line precharge voltage VBP is set to be lower than the cell plate voltage VCP. The effective range of the lower-limit value V1m of the "1" storage voltage V1 extends considerably further in terms of time, while the effective range of the lower-limit value V0m of the "0" storage node voltage V0 ends considerably earlier in terms of time. More specifically, the effective range of the lower-limit value V0m of the "0" storage node voltage V0 rate-controls the retention time tp.

However, in the conventional technology shown in FIG. 11, while the sensing signal of the "1" data after the elapse of retention time tp can be secured, the sensing signal of the "0" data is contrarily reduced in the manufacturing process of the latest miniaturized embedded DRAM because the tunnel leak current of the insulation film whose dielectric constant is high is remarkably increased. Because the bit-line precharge voltage VBP is set to be lower than the cell plate voltage VCP, the effective range of the lower-limit value V0m of the "0" storage node voltage V0 cannot be extended to such a range that the "0" storage node voltage V0 exceeds the bit-line precharge voltage VBP. Therefore, the effective range of the lower-limit value V0m of the "0" storage node voltage V0 rate-controls the retention time tp.

SUMMARY OF THE INVENTION

Therefore, a main object of the present invention is to improve a retention characteristic of "0" data and consequently improve retention characteristics of both of "1" and "0" data.

A semiconductor storage device according to the present invention comprises:

a plurality of memory cells each provided with an access transistor in which a source is connected to a bit line and a gate is connected to a word line and a capacitor in which a storage electrode is connected to a drain of the access transistor, the plurality of memory cells being placed in a matrix shape in column and row directions;

a sense amplifier circuit connected to the source of the access transistor via the bit line;

a bit-line precharge voltage generating circuit for generating a bit-line precharge voltage lower than a sense amplifier supply voltage to be supplied to the sense amplifier circuit and supplying the generated bit-line precharge voltage to the bit line; and a cell plate voltage generating circuit for generating a cell plate voltage set to be lower than the bit-line precharge voltage and supplying the generated cell plate voltage to a plate electrode of the capacitor.

According to the foregoing constitution, though the bit-line precharge voltage is set to be relatively low in order to extend the retention time in relation to the "1" storage voltage, the cell plate voltage is lower than the bit-line precharge voltage thus set to be relatively low. Therefore, though the "0" storage node voltage may increase and be drawn closer to the cell plate voltage due to the tunnel leakage of the insulation film of the capacitor, the "0" storage node voltage does not exceed the bit-line precharge voltage because the cell plate voltage, which is its upper limit, is set to be lower than the bit-line precharge voltage. The sensing signal of the "0" data can be thereby secured. As a result, the retention time can be extended, and the retention characteristics of the "1" and "0" data both can be consistently improved.

In the semiconductor storage device thus constituted, the bit-line precharge voltage generating circuit and the cell plate voltage generating circuit preferably comprise:

a differential amplifier which is feedback-controlled; and a reference voltage generating circuit for supplying a reference voltage to the differential amplifier, wherein the bit-line precharge voltage generating circuit and the cell plate voltage generating circuit share the reference voltage generating circuit.

According to the foregoing constitution, variation of a differential between the bit-line precharge voltage and the cell plate voltage is reduced though a power-supply voltage may be changed, which stabilizes the operation.

In the semiconductor storage device thus constituted, the cell plate voltage generating circuit preferably generates the cell plate voltage based on the bit-line precharge voltage. According to the foregoing constitution, though the bit-line precharge voltage may be different to the reference voltage with respect to the bit-line precharge generating voltage circuit due to variations in characteristics of the differential amplifier or the like, the cell plate voltage by the cell plate voltage generating circuit is dropped based on the bit-line precharge voltage which is actually supplied. Therefore, an accuracy with which the cell plate voltage is set can be maintained, and further improved.

In the semiconductor storage device thus constituted, the cell plate voltage generating circuit preferably generates the cell plate voltage based on the bit-line precharge voltage, and the bit-line precharge voltage generating circuit and the cell plate voltage generating circuit each preferably comprises a differential amplifier which is feedback-controlled, wherein the reference voltage generating circuit provided in the cell plate voltage generating circuit is connected to an output terminal of the bit-line precharge voltage generating circuit and thereby generates an intermediate voltage between the bit-line precharge voltage and a ground voltage. According to the foregoing constitution, though the bit-line precharge voltage may be different to the reference voltage due to current consumption in the bit-line precharge circuit, variations in characteristics of the differential amplifier or the like, the cell plate voltage is a voltage obtained when the bit-line precharge voltage actually supplied, which is used as a reference level, is dropped. Therefore, the accuracy with which the cell plate voltage is set can be maintained, and further, improved.

In the semiconductor storage device thus constituted, the bit-line precharge voltage generating circuit preferably comprises a differential amplifier which is feedback-controlled, wherein the cell plate voltage generating circuit is a source follower of the intermediate voltage between the bit-line precharge voltage and the ground voltage. The bit-line precharge voltage generating circuit, which supplies current to the bit-line precharge circuit which consumes the current, needs to be feedback-controlled. In contrast, the cell plate voltage generating circuit supplies the cell plate voltage for retaining the cell plate which does not consume any current at a constant voltage. Therefore, it is possible to omit the differential amplifier for the feedback control in the cell plate voltage generating circuit. Therefore, the omission of the differential amplifier can reduce a cell area by a size equivalent to the differential amplifier without any deterioration of the performance.

In the semiconductor storage device thus constituted, the differential voltage between the bit-line precharge voltage and the cell plate voltage is preferably set to a constant voltage independent from the sense amplifier supply voltage to be supplied to the sense amplifier circuit. According to the constitution, since the differential voltage between the bit-line precharge voltage and the cell plate voltage is set to the constant voltage which does not depend on the power-supply voltage, the retention characteristics can be improved without undermining the reliability of the insulation film of the capacitor in the memory cell when the power-supply voltage is increased.

In the semiconductor storage device thus constituted, the differential voltage between the bit-line precharge voltage and the cell plate voltage is preferably set to a voltage smaller than a threshold voltage of the access transistor.

In the semiconductor storage device thus constituted, the bit-line precharge generating voltage circuit and the cell plate voltage generating circuit each preferably comprise a differential amplifier which is feedback-controlled, wherein the reference voltage in the differential amplifier of the cell plate voltage generating circuit is set to an intermediate voltage between a voltage obtained when the bit-line precharge voltage is diode-dropped and the bit-line precharge voltage.

According to the constitution, wherein the differential voltage between the bit-line precharge voltage and the cell plate voltage is set to a constant voltage equal to or less than the threshold voltage of the transistor, the insulation film of the capacitor can be more reliable, and the retention characteristics can be improved.

Further, the cell plate voltage generating circuit preferably generates the cell plate voltage set to be lower than the bit-line precharge voltage by the bit-line precharge voltage generating circuit within a voltage range restricted by a voltage clamp and supplies the generated voltage to the plate electrode of the capacitor.

In the foregoing constitution, wherein the cell plate voltage generated by the cell plate voltage generating circuit is restricted to stay within the predetermined voltage range by the voltage clamp, the relevant cell plate voltage is not reduced to be lower than an arbitrary constant voltage though the cell plate voltage may be changed under the influence of noise. Therefore, the retention characteristics can be improved without undermining the reliability of the insulation film of the capacitor.

In the foregoing constitution, the bit-line precharge voltage generating circuit and the cell plate voltage generating circuit each preferably comprises a differential amplifier which is feedback-controlled, and the cell plate voltage generating circuit preferably comprises a diode clamp circuit connected to an output terminal of the cell plate voltage. According to the foregoing constitution, a semiconductor storage device which is superior in the retention characteristics and resistant to any influence by the noise can be easily realized.

In the foregoing constitution, the bit-line precharge voltage generating circuit preferably generates the bit-line precharge voltage dependent on a memory-cell substrate bias voltage, and the cell plate voltage generating circuit preferably generates the cell plate voltage dependent on the memory-cell substrate bias voltage.

In the foregoing constitution, the cell plate voltage and the precharge voltage which are dependent on the memory-cell substrate bias voltage are generated. Therefore, when the memory-cell substrate bias voltage is lowered and the memory-cell junction leakage is increased, and the leakage speed of the "1" data is thereby increased, the retention characteristic of the "1" data is improved because the bit-line precharge voltage is reduced at the same time, and the retention characteristic of the "0" data is improved because the cell plate voltage is reduced at the same time. More specifically, the variation of the memory-cell substrate bias voltage can be adjusted so that the data retention characteristics are not deteriorated.

The bit-line precharge voltage generating circuit and the cell plate voltage generating circuit each preferably comprises:

a differential amplifier which is feedback-controlled; and a reference voltage generating circuit for supplying a reference voltage to the differential amplifier, wherein the reference voltage generating circuits generate an intermediate voltage between the memory-cell substrate bias voltage and the sense amplifier supply voltage.

According to the foregoing constitution, a semiconductor storage device which is superior in the retention characteristics and resistant to the variation of the memory-cell substrate bias voltage can be easily realized.

In the foregoing constitution, the bit-line precharge voltage generating circuit and the cell plate voltage generating circuit each preferably comprises:

a differential amplifier; and a reference voltage generating circuit for supplying a reference voltage to the differential amplifier, wherein the reference voltage generating circuits change the reference voltage to be outputted between a normal operation mode and a test mode, and arbitrarily adjust the reference voltage in the test mode.

According to the foregoing constitution, the differential voltage between the bit-line precharge voltage and the cell plate voltage can be arbitrarily adjusted. As a result, the lower-limit values allowed in the operation with respect to the bit-line precharge voltage and the cell plate voltage and the dependency of the retention characteristics can be specifically evaluated.

According to the present invention, the cell plate voltage can be set to be lower than the bit-line precharge voltage, and the retention characteristics of the "1" and "0" data can be thereby consistently improved.

The semiconductor storage device according to the present invention is useful as a technology for improving a retention time in DRAM or the like.

BRIEF DESCRIPTION OF THE DRAWINGS

These and other objects as well as advantages of the invention will become clear by the following description of preferred embodiments of the invention, and they are specified in the claims attached hereto. A number of benefits not recited in this specification will come to the attention of the skilled in the art upon the implementation of the present invention.

FIG. 3 is a characteristic plot showing retention time dependency in the case of storage node voltages according to the preferred embodiment 1.

FIG. 5 is a circuit diagram illustrating constitutions of a bit-line precharge voltage generating circuit, a cell plate voltage generating circuit and a reference voltage generating circuit according to a preferred embodiment 3 of the present invention.

FIG. 9 is a circuit diagram illustrating constitutions of a bit-line precharge voltage generating circuit, a cell plate voltage generating circuit and a reference voltage generating circuit according to a preferred embodiment 7 of the present invention.

DETAILED DESCRIPTION OF THE INVENTION

Figure 1:
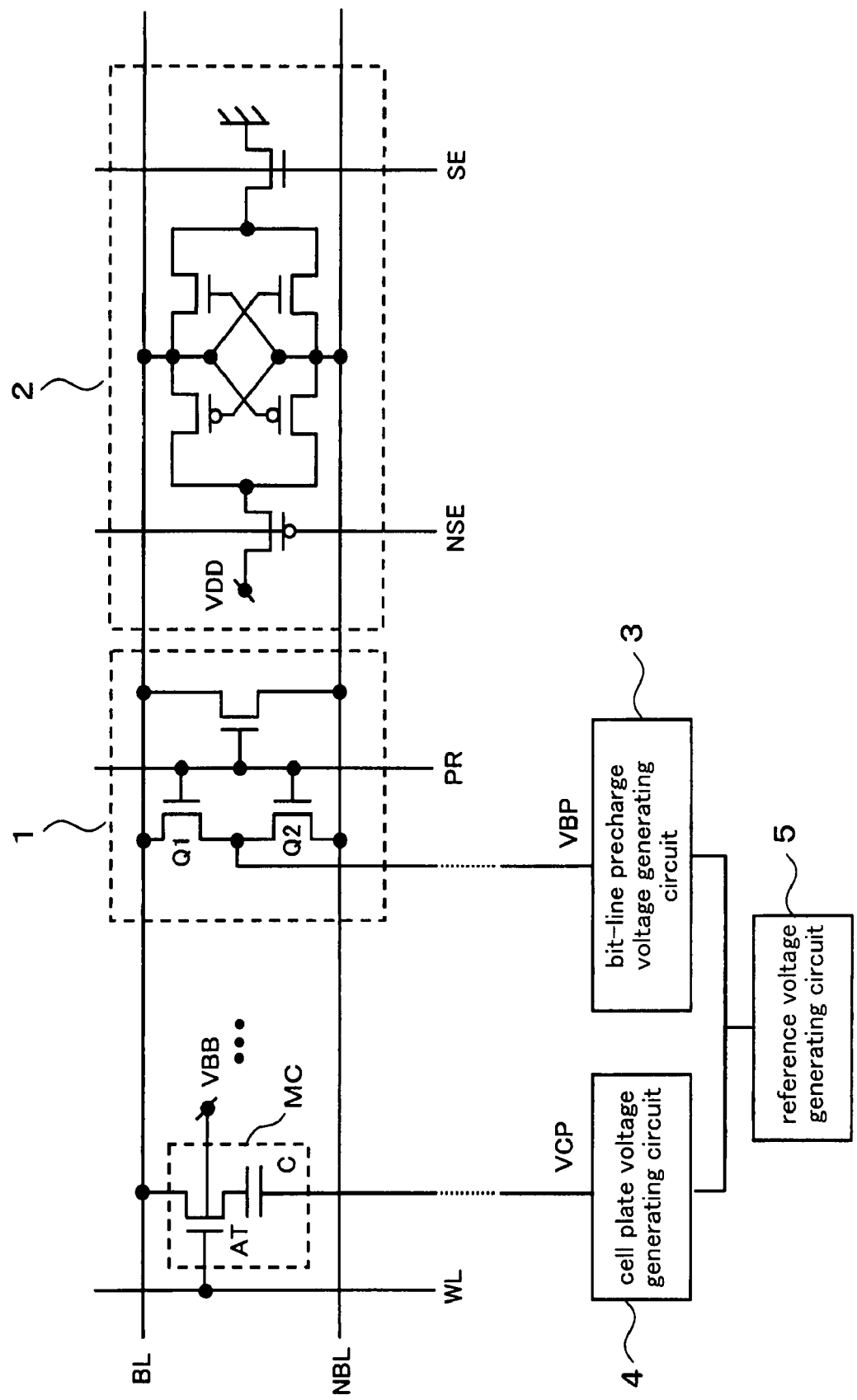
FIG. 1 is a circuit diagram illustrating a constitution of a semiconductor storage device according to a preferred embodiment 1 of the present invention.

Hereinafter, preferred embodiments of a semiconductor storage device according to the present invention are described in detail referring to the drawings.

Preferred Embodiment 1

FIG. 1 is a circuit diagram illustrating a constitution of a semiconductor storage device according to a preferred embodiment 1 of the present invention. In FIG. 1, BL and BNL denote a bit line, WL denotes a word line, MC denotes a memory cell, VBB denotes a memory-cell substrate bias voltage, 1 denotes a bit-line precharge circuit, PR denotes a precharge control signal line, 2 denotes a sense amplifier circuit, SE and NSE denote a sense amplifier control signal line, VDD denotes a power-supply voltage (sense amplifier supply voltage), 3 denotes a bit-line precharge voltage generating circuit, VBP denotes a bit-line precharge voltage, 4 denotes a cell plate voltage generating circuit, VCP denotes a cell plate voltage, and 5 denotes a reference voltage generating circuit.

The memory cell MC comprising an access transistor AT and a capacitor C is connected to the bit line BL and the word line WL. More specifically, a source of the access transistor AT is connected to the bit line BL, a drain of the access transistor AT is connected to a storage electrode of the capacitor C, and a gate of the access transistor AT is connected to the word line WL. A plate electrode of the capacitor C is connected to an output terminal of the cell plate voltage generating circuit 4, and a cell plate voltage VCP is applied to the capacitor C.

A large number of memory cells MC thus constituted are placed in parallel in a matrix shape in row and column directions, which constitute a memory cell array. The bit lines BL and NBL are connected to the sense amplifier circuit 2, and also connected to an output terminal of the bit-line precharge voltage generating circuit 3 via selection switches Q1 and Q2 of the bit-line precharge circuit 1, and the bit-line precharge voltage VBP is applied to the bit lines BL and NBL. The sense amplifier supply voltage VDD (power-supply voltage) to be supplied to the sense amplifier 2 is set to be higher than the bit-line precharge voltage VBP, while the cell plate voltage VCP is set to be lower than the bit-line precharge voltage VBP.

Figure 2:
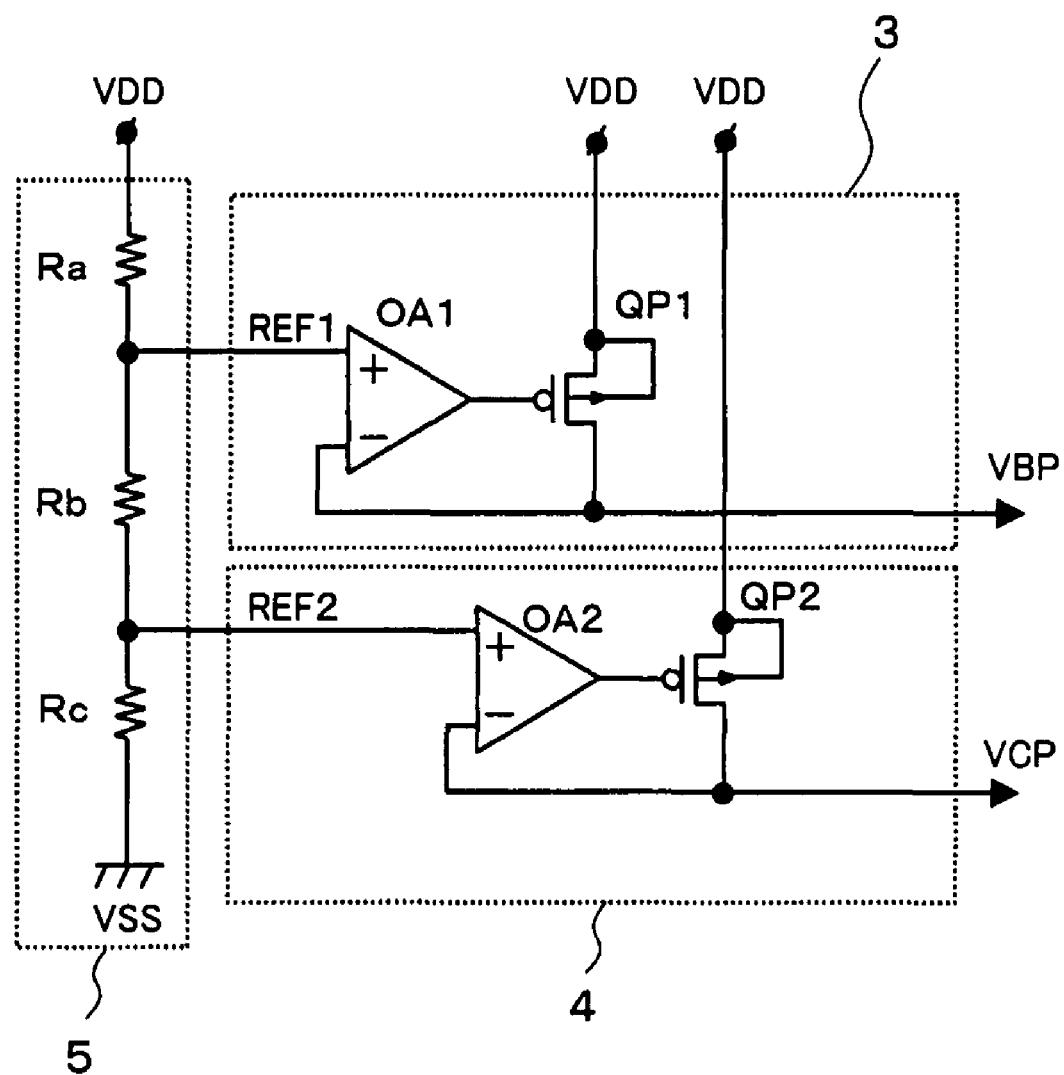
FIG. 2 is a circuit diagram illustrating constitutions of a bit-line precharge voltage generating circuit, a cell plate voltage generating circuit and a reference voltage generating circuit according to the preferred embodiment 1.

FIG. 2 is a circuit diagram illustrating constitutions of the bit-line precharge voltage generating circuit 3, the cell plate voltage generating circuit 4 and the reference voltage generating circuit 5 according to the preferred embodiment 1. In FIG. 2, Ra, Rb and Rc each denotes a resistive element, REF1 and REF2 each denotes a reference voltage, OA1 and OA2 each denotes a differential amplifier, and QP1 and QP2 each denotes a PMOS transistor.

The reference voltage generating circuit 5 comprises the resistive elements Ra, Rb and Rc serially interposed between a terminal of the power-supply voltage VDD and a terminal of a ground voltage VSS. The reference voltage generating circuit 5 supplies the reference voltages REF1 and REF2 generated when a differential voltage between the power-supply voltage VDD and the ground voltage VSS is resistively divided to the bit-line precharge voltage generating circuit 3 and the cell plate voltage generating circuit 4. More specifically, a connecting point between the resistive elements Ra and Rb is connected to a non-inversion input terminal (+) of the differential amplifier OA1 in the bit-line precharge voltage generating circuit 3. Further, a connecting point between the resistive elements Rb and Rc is connected to a non-inversion input terminal (+) of the differential amplifier OA2 in the cell plate voltage generating circuit 4. The bit-line precharge voltage generating circuit 3 and the cell plate voltage generating circuit 4 uses the reference voltage generating circuit 5 in a sharing manner.

The bit-line precharge voltage generating circuit 3 comprises the differential amplifier OA1 and the PMOS transistor QP1, wherein an output terminal of the differential amplifier OA1 is connected to a gate of the PMOS transistor QP1. A source of the PMOS transistor QP1 is connected to the terminal of the power-supply voltage VDD. A drain of the PMOS transistor QP1 is negative-feedback connected to an inversion input terminal (−) of the differential amplifier OA1 and also connected to the bit lines BL and NBL via the selection switches Q1 and Q2 of the bit-line precharge circuit 1 shown in FIG. 1, and thereby supplies the bit-line precharge voltage VBP to the bit lines BL and NBL.

The cell plate voltage generating circuit 4 comprises the differential amplifier OA2 and the PMOS transistor QP2, wherein an output terminal of the differential amplifier OA2 is connected to a gate of the PMOS transistor QP2, a source of the PMOS transistor QP2 is connected to the terminal of the power-supply voltage VDD, and a drain of the PMOS transistor QP2 is negative-feedback connected to an inversion input terminal (−) of the differential amplifier OA2 and also connected to the plate electrode of the capacitor C in the memory cell MC shown in FIG. 1, and thereby supplies the cell plate voltage VCP to the memory cell MC.

In the bit-line precharge voltage generating circuit 3, the bit-line precharge voltage VBP is controlled to have a potential equal to that of the reference voltage REF1 based on the feedback control in the differential amplifier OA1. In the cell plate voltage generating circuit 4, the cell plate voltage VCP in the differential amplifier OA2 is controlled to have a potential equal to that of the reference voltage REF2 based on the feedback control.

The reference voltage REF2 of the differential amplifier OA2 is always lower than the reference voltage REF1 of the differential amplifier OA1. Therefore, the cell plate voltage VCP is always set to be lower than the bit-line precharge voltage VBP.

Thus constituted, the semiconductor storage device according to the present preferred embodiment exerts the following effects. As shown in FIG. 3, though a level of the bit-line precharge voltage VBP may be set to be lower than ½ of the power-supply voltage VDD to be supplied to the sense amplifier circuit 2 in order to extend a retention time tp of "1" storage voltage V1, the cell plate voltage VCP ("0" storage node voltage V0 increased by the tunnel current of the insulation film of the capacitor is drawn closer to the voltage VCP) is always lower than the bit-line precharge voltage VBP. Therefore, a sensing signal of the "0" data is secured, which improves the retention characteristics.

When assumed that a potential difference between the bit-line precharge voltage VBP and the "0" storage node voltage V0 is ΔVDL (ΔVDL=VBP−V0), and a potential difference ΔVDH between the "1" storage voltage V1 and the bit-line precharge voltage VBP is (ΔVDH=V1−VBP), a dimension of a sensing signal ΔVL of the "0" data, and a dimension of a sensing signal ΔVH of the "1" data in the memory cell MC are respectively expressed as follows.

$$\Delta VL = k \cdot \Delta VDL = k \cdot (VBO - V0)$$

$$\Delta VH = k \cdot \Delta VDH = k \cdot (V1 - VBP)$$

$$k = 1/(Cb/CS + 1)$$

Figure 11:
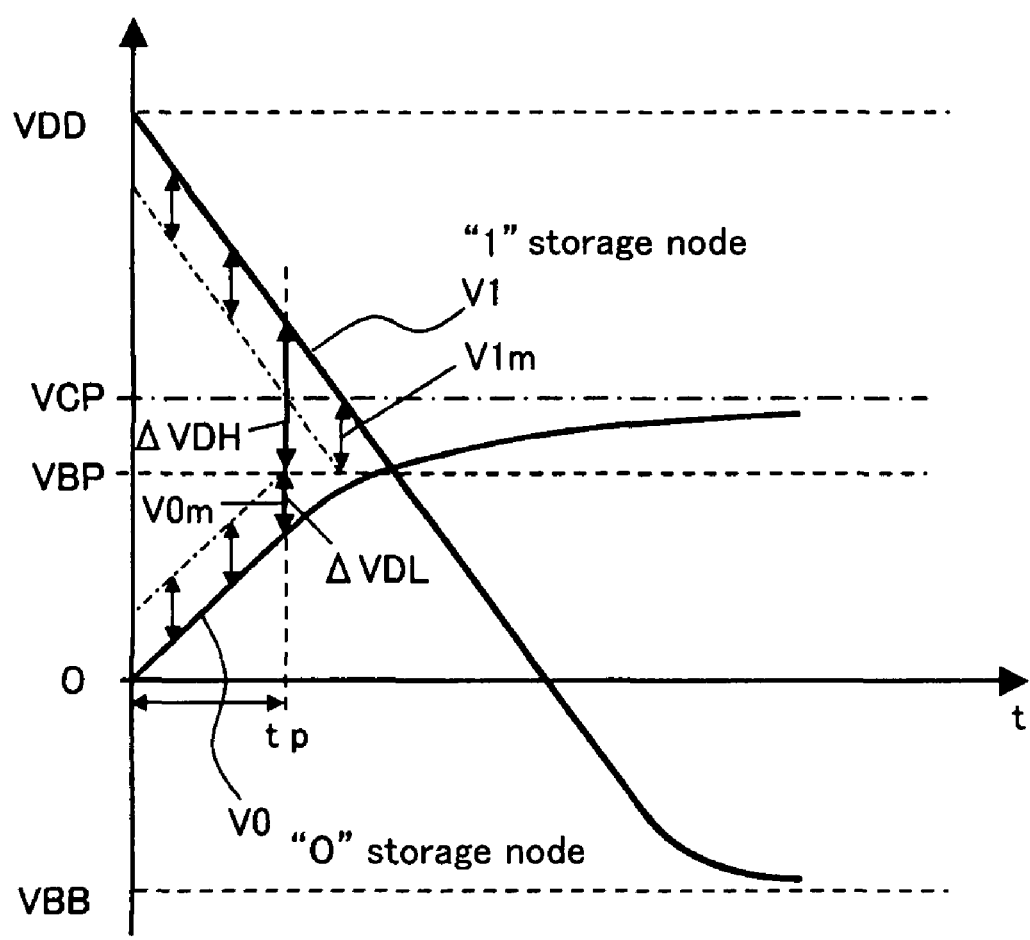
FIG. 11 is a characteristic plot showing retention time dependency in the case of storage node voltages according to another conventional technology.

An attention is now paid to the "0" storage node voltage V0. The "0" storage node voltage V0 increases and is drawn closer to the cell plate voltage VCP due to the tunnel leakage of the capacitor insulation film, and its upper limit is the cell plate voltage VCP. The cell plate voltage VCP is set to be lower than the bit-line precharge voltage VBP, and therefore, the "0" storage node voltage V0 does not exceed the bit-line precharge voltage VBP. In the case of the conventional technology shown in FIG. 11, the "0" storage node voltage V0 may exceed the bit-line precharge voltage VBP because the bit-line precharge voltage VBP is set to be lower than the cell plate voltage VCP. This problem can be surely avoided in the present preferred embodiment.

An effective range of a lower-limit value V0m of the differential voltage (VBP−V0) in relation to the "0" storage node voltage V0 is set so that it extends considerably further in terms of time. An effective range of a lower-limit value V1m of the differential voltage (V1−VBP) in relation to the "1" storage voltage V1 is set with a large margin so that the retention time tp can be extended. As a result, the retention characteristics of the "1" and "0" data can be consistently improved.

Preferred Embodiment 2

Figure 4:
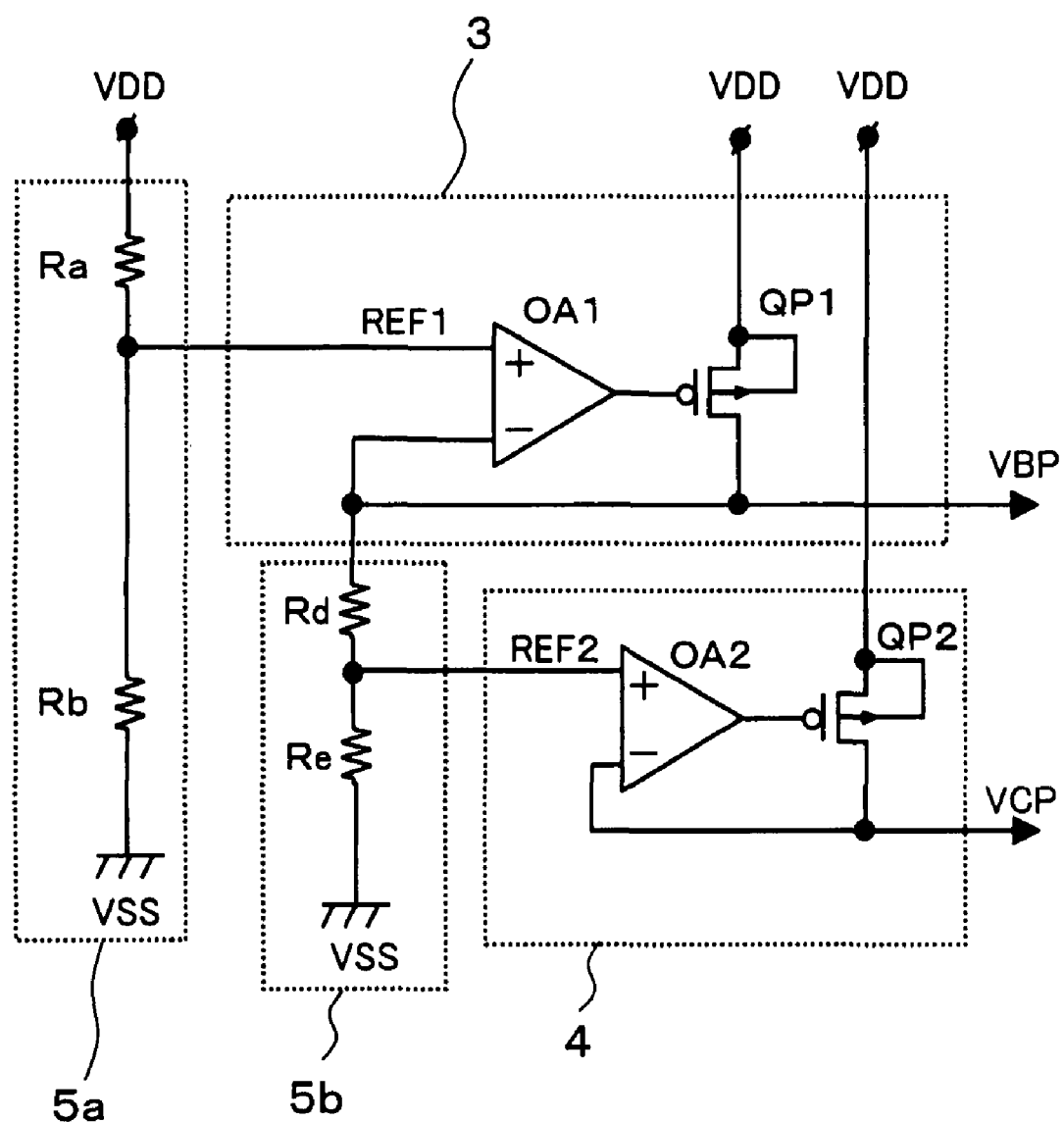
FIG. 4 is a circuit diagram illustrating constitutions of a bit-line precharge voltage generating circuit, a cell plate voltage generating circuit and a reference voltage generating circuit according to a preferred embodiment 2 of the present invention.

FIG. 4 is a circuit diagram illustrating a constitution of a semiconductor storage device according to a preferred embodiment 2 of the present invention. In FIG. 4, the same reference symbols as those shown in FIG. 2 according to the preferred embodiment 1 denote the same components. In the present preferred embodiment, in addition to a reference voltage generating circuit 5a for supplying the reference voltage to the differential amplifier OA1 in the bit-line precharge voltage generating circuit 3, a reference voltage generating circuit 5b for supplying the reference voltage to the differential amplifier OA2 in the cell plate voltage generating circuit 4 is provided. In the reference voltage generating circuit 5b, a serial circuit comprising a resistive element Rd and a resistive element Re is inserted and connected to between the output terminal of the bit-line precharge voltage generating circuit 3 and the terminal of the ground voltage VSS, and a connecting point b between the resistive elements Rd and Re is connected to the non-inversion input terminal (+) of the differential amplifier OA2. The reference voltage REF2 set in response to the differential amplifier OA2 is set in such a manner that the bit-line precharge voltage VBP outputted from the bit-line precharge voltage generating circuit 3 is restively divided by the resistive elements Rd and Re. As a result, the cell plate voltage VCP is generated based on the bit-line precharge voltage VBP. The rest of the constitution, which is similar to that of the preferred embodiment 1, is not redundantly described.

In the present preferred embodiment, the cell plate voltage VCP is a voltage obtained when the bit-line precharge voltage VBP actually supplied, which is used as a reference level, is dropped. Therefore, the cell plate voltage VCP can be set with a high accuracy though the bit-line precharge voltage VBP may be different to the reference voltage REF1 due to the current consumption in the bit-line precharge circuit 1 and variations in characteristics of the differential amplifier OA1.

Preferred Embodiment 3

FIG. 5 is a circuit diagram illustrating a constitution of a semiconductor storage device according to a preferred embodiment 3 of the present invention. In FIG. 5, the same reference symbols as those shown in FIG. 4 according to the preferred embodiment 2 denote the same components. In the present preferred embodiment, the differential amplifier OA2 in the cell plate voltage generating circuit 4 is omitted, and the connecting point between the resistive elements Rd and Re in the reference voltage generating circuit 5b is directly connected to the gate of the PMOS transistor QP2. Accordingly, the cell plate voltage generating circuit 4 functions as a source follower of an intermediate voltage between the bit-line precharge voltage VBP by the bit-line precharge voltage generating circuit 3 and the ground voltage VSS. The rest of the constitution, which is similar to that of the preferred embodiment 1, is not redundantly described.

The bit-line precharge voltage generating circuit 3 supplies current to the bit-line precharge circuit 1 which consumes the current, and requires the differential amplifier OA1 for the feedback control. The cell plate voltage generating circuit 4, which retains the cell plate of the capacitor C in the memory cell MC not consuming any current at a constant voltage, supplies the cell plate voltage to the relevant cell plate. Therefore, the differential amplifier OA2 for the feedback control can be omitted in the cell plate generating circuit 4. The omission of the differential amplifier OA2 directly leads to the reduction in the cell area without any deterioration of the performance.

Preferred Embodiment 4

Figure 6:
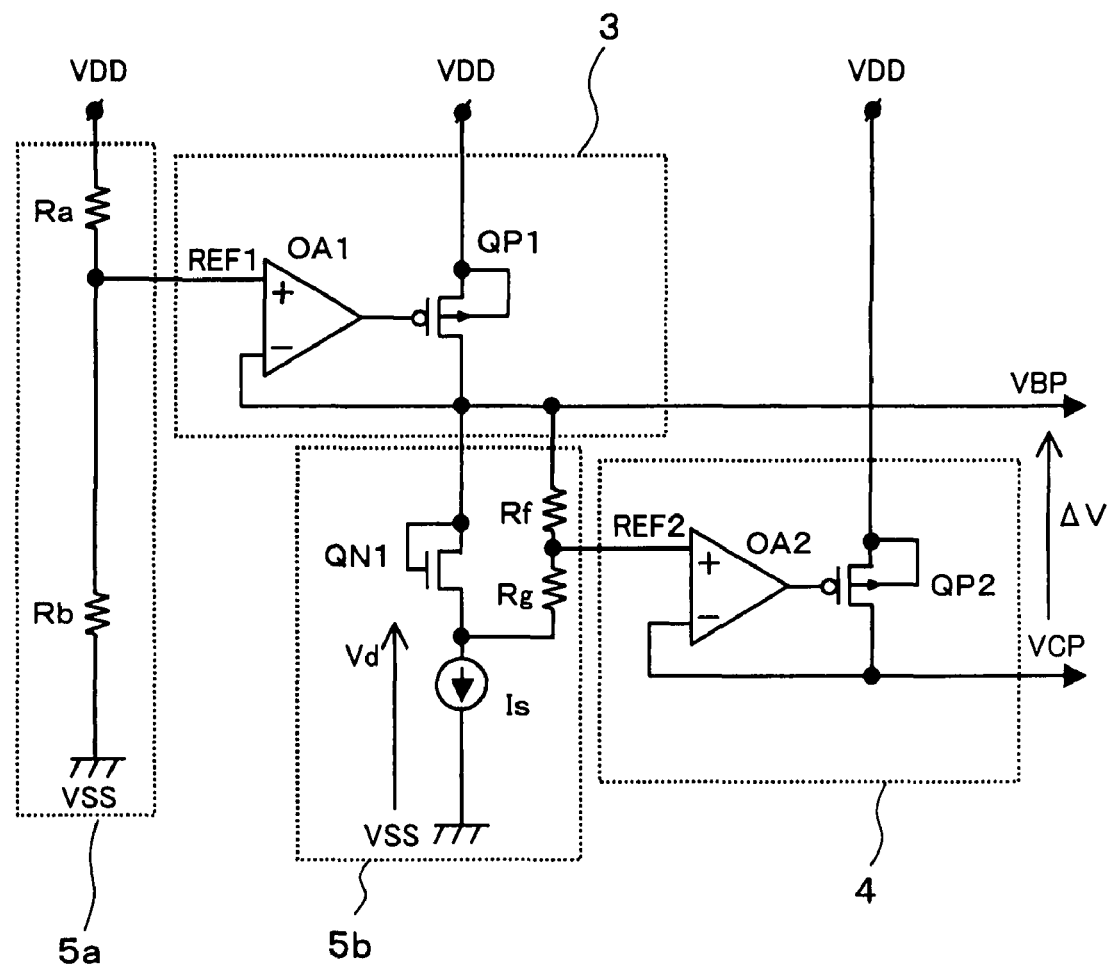
FIG. 6 is a circuit diagram illustrating constitutions of a bit-line precharge voltage generating circuit, a cell plate voltage generating circuit and a reference voltage generating circuit according to a preferred embodiment 4 of the present invention.

FIG. 6 is a circuit diagram illustrating a constitution of a semiconductor storage device according to a preferred embodiment 4 of the present invention. In FIG. 6, the same reference symbols as those shown in FIG. 4 according to the preferred embodiment 2 denote the same components. The present preferred embodiment is characterized in the constitution of the reference voltage generating circuit 5b provided in response to the cell plate voltage generating circuit 4.

In FIG. 6, QN1 denotes an NMOS transistor, Rf and Rg each denotes a resistive element, and Is denotes a constant current source. A drain of the NMOS transistor QN1 is connected to the drain of the PMOS transistor QP1 which outputs the bit-line precharge voltage VBP, and a source of the NMOS transistor QN1 is connected to the terminal of the ground voltage VSS via the constant current source Is. The NMOS transistor QN1 has a diode structure where its gate is connected to the drain. A serial circuit comprising the resistive elements Rf and Rg is connected in parallel to the NMOS transistor QN1. A connecting point between the resistive element Rf and the resistive element Rg is connected to the non-inversion input terminal (+) of the differential amplifier OA2 of the cell plate voltage generating circuit 4.

The reference voltage REF2 of the differential amplifier OA2 is a voltage obtained when the dropped voltage by the resistive element Rf is subtracted from the bit-line precharge voltage VBP. The dropped voltage is controlled to be constant by the constant current source Is. The cell plate voltage VCP is controlled to be equal to the reference voltage REF. As a result, the differential voltage ΔV between the bit-line precharge voltage VBP and the cell plate voltage VCP is equal to the dropped voltage of the resistive element Rf. The differential voltage ΔV thus set is independent from the power-supply voltage VDD.

The differential voltage ΔV between the bit-line precharge voltage VBP and the cell plate voltage VCP is desirably a minimum voltage capable of outputting the sensing signal (up to 100 mV) because the voltage difference applied to the insulation film of the capacitor C in the memory cell MC when the "1" data is written in the memory cell MC is increased as the differential voltage ΔV is increased, increasing the possibility of the breakage of the insulation film.

In the present preferred embodiment, the bit-line precharge voltage generating circuit 3 and the cell plate voltage generating circuit 4 respectively comprise the differential amplifiers OA1 and OA2 which are feedback-controlled. Further, the reference voltage REF2 of the differential amplifier OA2 in the cell plate voltage generating circuit 4 is set to be an intermediate voltage between the bit-line precharge voltage VBP and a voltage Vd obtained when the bit-line precharge voltage VBP is diode-dropped by the NMOS transistor QN1 having the diode structure.

According to the present preferred embodiment, the differential voltage ΔV between the bit-line precharge voltage VBP and the cell plate voltage VCP is set to a constant voltage equal to or less than a threshold value of the transistor independent from the power-supply voltage VDD to be supplied to the sense amplifier circuit 2. Therefore, the retention characteristics can be improved without undermining the reliability of the insulation film of the capacitor C.

Preferred Embodiment 5

Figure 7:
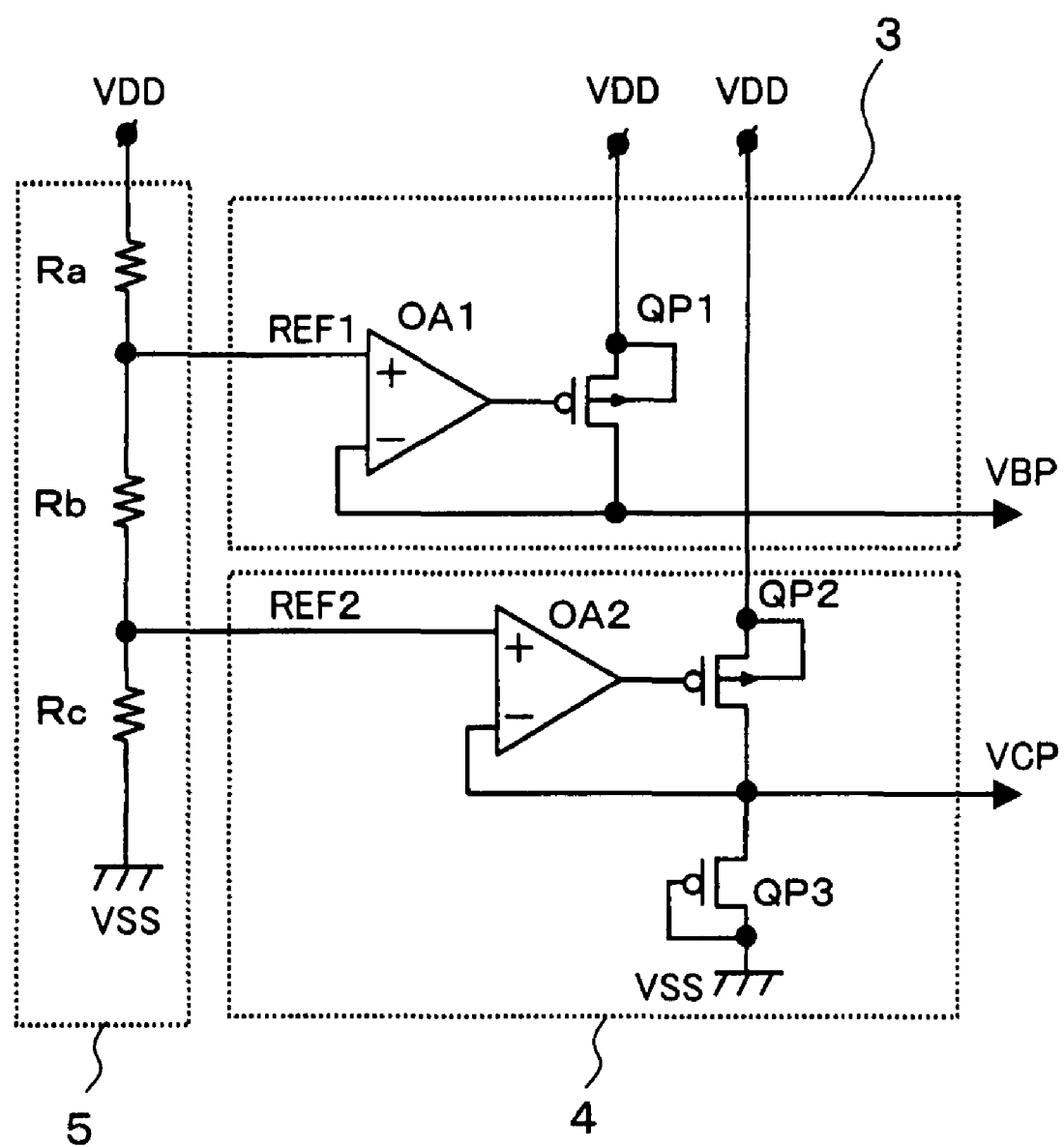
FIG. 7 is a circuit diagram illustrating constitutions of a bit-line precharge voltage generating circuit, a cell plate voltage generating circuit and a reference voltage generating circuit according to a preferred embodiment 5 of the present invention.

FIG. 7 is a circuit diagram illustrating a constitution of a semiconductor storage device according to a preferred embodiment 4 of the present invention. In FIG. 7, the same reference symbols as those shown in FIG. 2 according to the preferred embodiment 1 denote the same components. In the present preferred embodiment, a PMOS transistor QP3 having a diode structure where a gate is connected to a drain is provided, and the PMOS transistor QP3 is connected to an output node of the cell plate voltage VCP in the cell plate voltage generating circuit 4 and thereby functions as a diode clamp circuit.

According to the present preferred embodiment, though the cell plate voltage VCP may change under the influence of noise, the cell plate voltage VCP does not become lower than an arbitrary constant voltage. Therefore, the retention characteristics can be improved without undermining the reliability of the capacitor insulation film.

Preferred Embodiment 6

Figure 8:
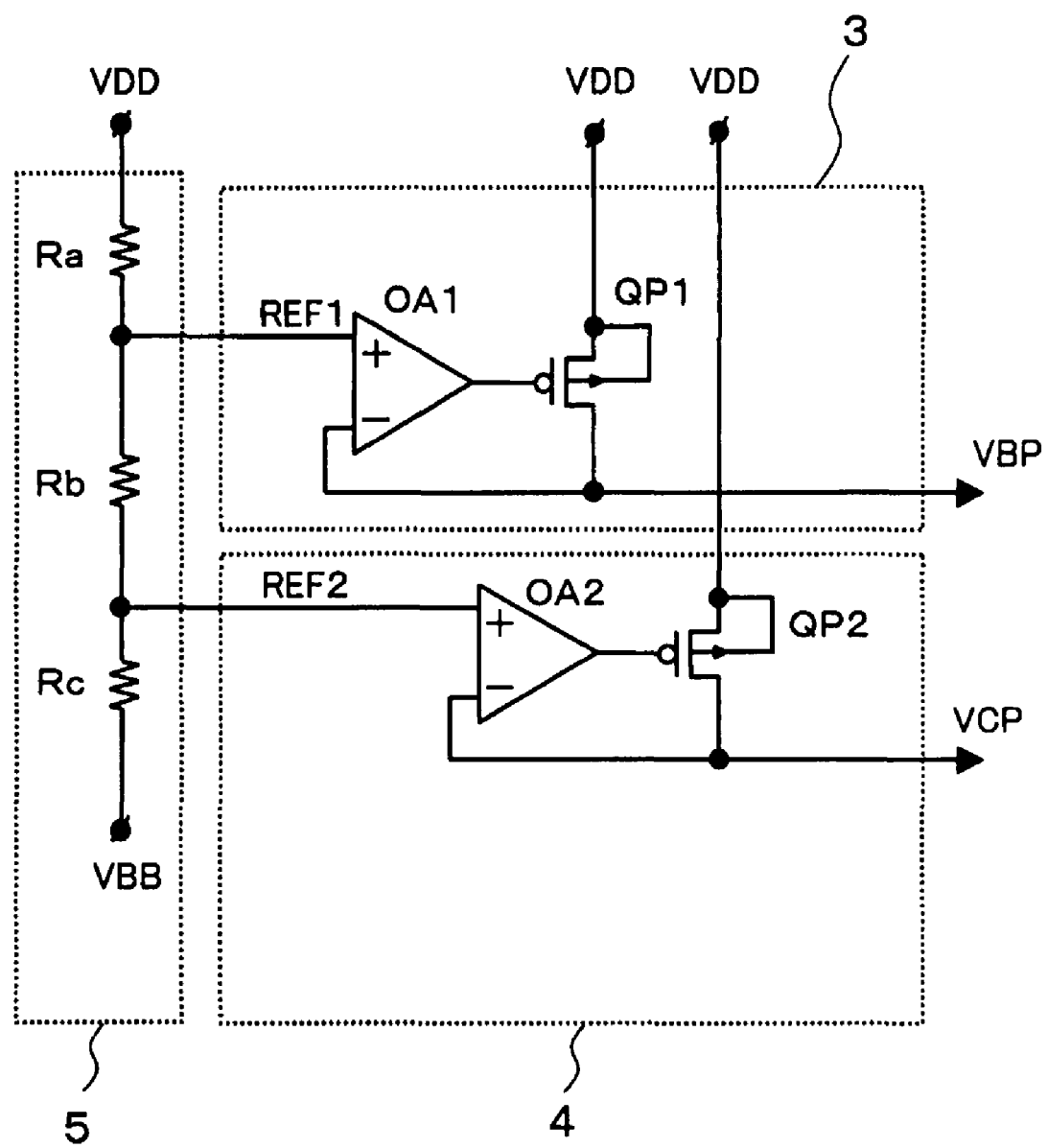
FIG. 8 is a circuit diagram illustrating constitutions of a bit-line precharge voltage generating circuit, a cell plate voltage generating circuit and a reference voltage generating circuit according to a preferred embodiment 6 of the present invention.
Figure 10:
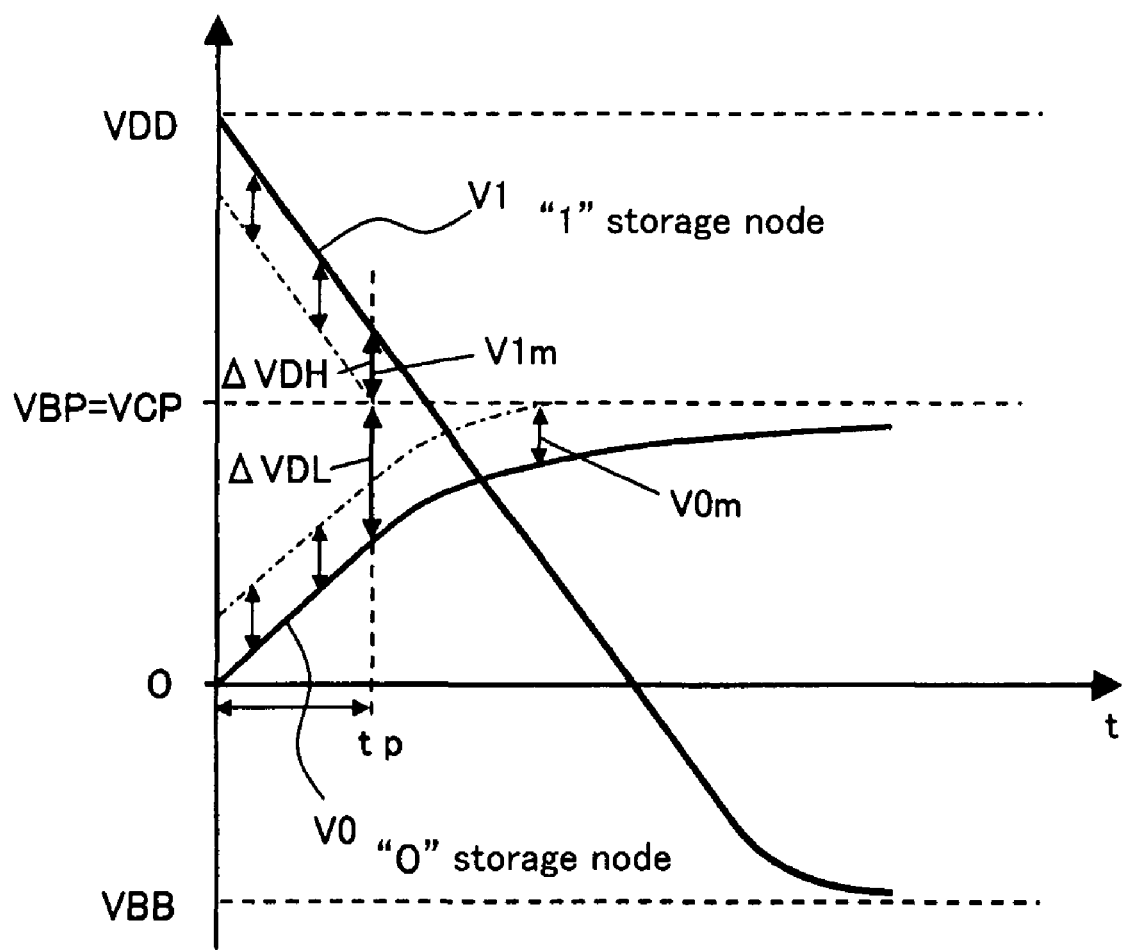
FIG. 10 is a characteristic plot showing retention time dependency in the case of storage node voltages according to a conventional technology.

FIG. 8 is a circuit diagram illustrating a constitution of a semiconductor storage device according to a preferred embodiment 6 of the present invention. In FIG. 8, the same reference symbols as those shown in FIG. 2 according to the preferred embodiment 1 denote the same components. In the case of the reference voltage generating circuit 5 according to the preferred embodiment 1, the resistive elements Ra, Rb and Rc which are serially connected are connected to the terminal of the power-supply voltage VDD and the terminal of the ground voltage VSS. In the present preferred embodiment, the resistive elements Ra, Rb and Rc which are serially connected are connected to between the terminal of the power-supply voltage VDD and the terminal of a memory-cell substrate bias voltage VBB. Accordingly, the reference voltages REF1 and REF2 corresponding to the bit-line precharge voltage generating circuit 3 and the cell plate voltage generating circuit 4 are generated as intermediate voltages between the power-supply voltage VDD and the memory-cell substrate bias voltage VBB.

According to the present preferred embodiment, the bit-line precharge voltage VBP is reduced at the same time as the reduction of the memory-cell substrate bias voltage VBB though the memory-cell junction leakage is increased and the leakage speed of the "1" data is thereby increased. As a result, the retention characteristic of the "1" data is improved. Further, the retention characteristic of the "0" data is improved because the cell plate voltage VCP is reduced at the same time. Based on the foregoing reasons, the variation of the memory-cell substrate bias voltage VBB can be adjusted so that the data retention characteristics are not deteriorated.

Preferred Embodiment 7

FIG. 9 is a circuit diagram illustrating a constitution of a semiconductor storage device according to a preferred embodiment 7 of the present invention. In FIG. 9, the same reference symbols as those shown in FIG. 2 according to the preferred embodiment 1 denote the same components. In the present preferred embodiment, the reference voltage generating circuit 5 can change the reference voltage to be outputted in a normal operation mode and a test mode. Referring to components shown in FIG. 9 which are added to the structure of FIG. 2, Rva, Rvb, Rvc, and Rvd are variable resistive elements, and SW1, SW2, SW3 and SW4 are switch elements. The switch element SW1 is interposed between the resistive elements Ra and Rb, and the switch element SW2 is interposed between the resistive elements Rb and Rc. A serial circuit comprising the variable resistive elements Rva and Rvb is connected to between the terminal of the power-supply voltage VDD and the terminal of the ground voltage VSS, and a connecting point between the variable resistances Rva and Rvb is connected to the non-inversion input terminal (+) of the differential amplifier OA1 via the switch element SW3. A serial circuit comprising the variable resistive elements RVc and Rvd is connected to between the terminal of the power-supply voltage VDD and the terminal of the ground voltage VSS, and a connecting point between the variable resistances Rvc and Rvd is connected to the non-inversion input terminal (+) of the differential amplifier OA2 via the switch element SW4.

In the normal operation mode, the switches SW1 and SW2 are turned on, while the switches SW3 and SW4 are turned off. In the test mode, the switches SW1 and SW2 are turned off, while the switches SW3 and SW4 are turned on. Accordingly, the reference voltage generating circuit 5 can switch the reference voltage generating circuit to be supplied to the bit-line precharge voltage generating circuit 3 and the cell plate voltage generating circuit 4 between the normal operation mode and the test mode.

Therefore, in the test mode, resistive values of the variable resistive elements Rva, Rvb, Rvc and Rvd can be arbitrarily and independently adjusted. More specifically, the differential voltage ΔV between the bit-line precharge voltage VBP and the cell plate voltage VCP can be arbitrarily adjusted. Accordingly, the lower limit-values allowed in the operation with respect to the bit-line precharge voltage and the cell plate voltage and the dependency of the retention characteristics can be specifically evaluated.

It is needles to say that the present invention is not limited to the foregoing preferred embodiments, and can be variously modified within the scope of the invention. For example, the constitutions according to the preferred embodiments 3 and 6 may be combined.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. A semiconductor storage device comprising:
a plurality of memory cells each provided with an access transistor in which a source is connected to a bit line and a gate is connected to a word line and a capacitor in which a storage electrode is connected to a drain of the access transistor, the plurality of memory cells being placed in a matrix shape in column and row directions;
a sense amplifier circuit connected to the source of the access transistor via the bit line;
a reference voltage generating circuit for generating a first reference voltage and a second reference voltage in which the second reference voltage is generated by depressing voltage of the first reference voltage;
a bit-line precharge voltage generating circuit for controlling potential of a bit-line precharge voltage to be equivalent to the first reference voltage, the bit-line precharge voltage generating circuit, the bit-line precharge voltage generating circuit comprising a first differential amplifier having the first reference voltage and the bit-line precharge voltage as inputs and a first pull-up element for pulling up the bit-line precharge voltage based on output of the first differential amplifier;

a cell plate voltage generating circuit for controlling potential of a cell plate voltage to be equivalent to the second reference voltage, the cell plate voltage generating circuit comprising a second differential amplifier having the second reference voltage and the cell plate voltage as inputs and a second pull-up element for pulling up the cell plate voltage based on output of the second differential amplifier.

2. A semiconductor storage device comprising:

a plurality of memory cells each provided with an access transistor in which a source is connected to a bit line and a gate is connected to a word line and a capacitor in which a storage electrode is connected to a drain of the access transistor, the plurality of memory cells being placed in a matrix shape in column and row directions;

a sense amplifier circuit connected to the source of the access transistor via the bit line;

a bit-line precharge voltage generating circuit for generating a bit-line precharge voltage lower than a sense amplifier supply voltage to be supplied to the sense amplifier circuit and supplying the generated bit-line precharge voltage to the bit line; and a cell plate voltage generating circuit for generating a cell plate voltage set to be lower than the bit-line precharge voltage, which is lower than the sense amplifier supply voltage, and supplying the generated cell plate voltage to a plate electrode of the capacitor, wherein the cell plate voltage generating circuit generates the cell plate voltage based on the bit-line precharge voltage.

3. The semiconductor storage device as claimed in claim 2, wherein:

the bit-line precharge voltage generating circuit and the cell plate voltage generating circuit each comprise a differential amplifier which is feedback-controlled, and the reference voltage generating circuit provided in the cell plate voltage generating circuit is connected to an output terminal of the bit-line precharge voltage generating circuit and thereby generates an intermediate voltage between the bit-line precharge voltage and a ground voltage.

4. The semiconductor storage device as claimed in claim 2, wherein the bit-line precharge voltage generating circuit comprises a differential amplifier which is feedback-controlled, wherein the cell plate voltage generating circuit is a source follower of an intermediate voltage between the bit-line precharge voltage and a ground voltage.

5. The semiconductor storage device as claimed in claim 2, wherein a differential voltage between the bit-line precharge voltage and the cell plate voltage is set to a constant voltage independent from a sense amplifier supply voltage to be supplied to the sense amplifier circuit.

6. The semiconductor storage device as claimed in claim 5, wherein a differential voltage between the bit-line precharge voltage and the cell plate voltage is set to a voltage smaller than a threshold voltage of the access transistor.

7. A semiconductor storage device comprising:

a plurality of memory cells each provided with an access transistor in which a source is connected to a bit line and a gate is connected to a word line and a capacitor in which a storage electrode is connected to a drain of the access transistor, the plurality of memory cells being placed in a matrix shape in column and row directions;

a sense amplifier circuit connected to the source of the access transistor via the bit line;

a bit-line precharge voltage generating circuit for generating a bit-line precharge voltage lower than a sense amplifier supply voltage to be supplied to the sense amplifier circuit and supplying the generated bit-line precharge voltage to the bit line; and a cell plate voltage generating circuit for generating a cell plate voltage set to be lower than the bit-line precharge voltage, which is lower than the sense amplifier supply voltage, and supplying the generated cell plate voltage to a plate electrode of the capacitor, wherein:

the cell plate voltage generating circuit generates the cell plate voltage based on the bit-line precharge voltage, a differential voltage between the bit-line precharge voltage and the cell plate voltage is set to a constant voltage independent from a sense amplifier supply voltage to be supplied to the sense amplifier circuit, a differential voltage between the bit-line precharge voltage and the cell plate voltage is set to a voltage smaller than a threshold voltage of the access transistor, the bit-line precharge generating voltage circuit and the cell plate voltage generating circuit each comprise a differential amplifier which is feedback-controlled, and the reference voltage in the differential amplifier of the cell plate voltage generating circuit is set to an intermediate voltage between a voltage obtained when the bit-line precharge voltage is diode-dropped and the bit-line precharge voltage.

8. The semiconductor storage device as claimed in claim 1, wherein the cell plate voltage generating circuit generates the cell plate voltage set to be lower than the bit-line precharge voltage by the bit-line precharge voltage generating circuit within a voltage range restricted by a voltage clamp and supplies the generated voltage to the plate electrode of the capacitor.

9. The semiconductor storage device as claimed in claim 8, wherein each of the first and second differential amplifier of the bit-line precharge voltage generating circuit and the cell plate voltage generating circuit is a differential amplifier which is feedback-controlled, and the cell plate voltage generating circuit comprises a diode clamp circuit connected to an output terminal of the cell plate voltage.

10. The semiconductor storage device as claimed in claim 1, wherein the bit-line precharge voltage generating circuit generates the bit-line precharge voltage dependent on a memory-cell substrate bias voltage, and the cell plate voltage generating circuit generates the cell plate voltage dependent on the memory-cell substrate bias voltage.

11. The semiconductor storage device as claimed in claim 10, wherein the second reference voltage is higher than the memory-cell substrate bias voltage.

12. A semiconductor storage device comprising:

a plurality of memory cells each provided with an access transistor in which a source is connected to a bit line and a gate is connected to a word line and a capacitor in which a storage electrode is connected to a drain of the access transistor, the plurality of memory cells being placed in a matrix shape in column and row directions;

a sense amplifier circuit connected to the source of the access transistor via the bit line;

a bit-line precharge voltage generating circuit for generating a bit-line precharge voltage lower than a sense amplifier supply voltage to be supplied to the sense amplifier circuit and supplying the generated bit-line precharge voltage to the bit line; and a cell plate voltage generating circuit for generating a cell plate voltage set to be lower than the bit-line precharge voltage, which is lower than the sense amplifier supply voltage, and supplying the generated cell plate voltage to a plate electrode of the capacitor, wherein the bit-line precharge voltage generating circuit and the cell plate voltage generating circuit each comprise:

a differential amplifier; and a reference voltage generating circuit for supplying a reference voltage to the differential amplifier, wherein the reference voltage generating circuits change the reference voltage to be outputted between a normal operation mode and a test mode, and arbitrarily adjust the reference voltage in the test mode.

* * * * *